(12) United States Patent
Chen et al.

(10) Patent No.: US 8,261,219 B2
(45) Date of Patent: Sep. 4, 2012

(54) SYSTEM ON CHIP DEVELOPMENT WITH RECONFIGURABLE MULTI-PROJECT WAFER TECHNOLOGY

(75) Inventors: Kun-Lung Chen, Taipei (TW); Shine Chien Chung, Taipei Hsien (TW); Yung-Chin Hou, Taipei (TW); Yu-Chun Wu, Allentown, PA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 442 days.

(21) Appl. No.: 12/133,323

(22) Filed: Jun. 4, 2008

(65) Prior Publication Data
US 2008/0235635 A1    Sep. 25, 2008

(51) Int. Cl.
*G06F 17/50* (2006.01)
(52) U.S. Cl. ........ 716/110; 716/116; 716/117; 716/132; 716/135; 716/138
(58) Field of Classification Search .................. 716/100, 716/110, 116–117, 132, 135, 138
See application file for complete search history.

(56) References Cited

U.S. PATENT DOCUMENTS

| 6,237,132 B1 | 5/2001 | Dean et al. ...................... 716/18 |
| 2005/0193353 A1 | 9/2005 | Malekkhosravi et al. ........ 716/1 |
| 2005/0257177 A1 | 11/2005 | Chen et al. ....................... 716/1 |
| 2005/0273749 A1* | 12/2005 | Kirk ................................. 716/16 |
| 2008/0094102 A1* | 4/2008 | Osann ............................ 326/39 |

FOREIGN PATENT DOCUMENTS

CN    1934571    3/2007

OTHER PUBLICATIONS

CN Office Action Appln. No. 200610078986X dated Jul. 9, 2007.
Chinese Office Action for CN 1934571A.

* cited by examiner

*Primary Examiner* — Paul Dinh
(74) *Attorney, Agent, or Firm* — K&L Gates LLP

(57) ABSTRACT

A method is disclosed for designing a semiconductor circuit on a multi-project wafer (MPW). One or more standard modules designed by one or more vendors with verified functions are first identified. Some of the standard modules are charged based on usage. At least one reconfigurable module of the MPW is programmed by making one or more connections through one or more connection layers. The standard modules are further connected with the programmed reconfigurable module according to the predetermined design of the circuit. The completed circuit is then verified for final uses.

10 Claims, 4 Drawing Sheets

SYSTEM ON CHIP DEVELOPMENT WITH RECONFIGURABLE MULTI-PROJECT WAFER TECHNOLOGY

CROSS REFERENCE

This application is related to and claims priority to allowed U.S. patent application Ser. No. 11/119,086, filed Apr. 29, 2005 entitled "SYSTEM ON CHIP DEVELOPMENT WITH RECONFIGURABLE MULTI-PROJECT WAFER TECHNOLOGY" which is incorporated by reference herein.

BACKGROUND

The present disclosure relates generally to semiconductor devices, and more particularly, to the utilization of reconfigurable multi-project wafer (MPW) semiconductors to reduce the time to market, development costs, and risk inherent in today's "system on a chip" designs.

As semiconductor process technology migrates into the deep sub-micron geometries, and "system on a chip" designs become much more complex, the process steps, development time, costs, and technical risk to develop these circuit designs grow exponentially. A complex circuit may require digital signal processing, Ethernet, memory, high speed input/output modules, analog-to-digital converters (ADCs), digital-to-analog converters (DACs), or other unique circuitry. In the conventional circuit chip design approach, each of these modules must be designed and verified prior to integration into the circuit. The operational performance of the circuit can only then be verified. Circuit developers expend an enormous amount of time and money for prototyping these devices and getting them into production. The performance of deep sub-micron devices can be adversely affected by the effects of cross-talk, electro-migration, wire delay, etc. that may present additional technical risk to the development schedule. This process results in time consuming mask and wafer iteration runs leading to long time to market, high and growing development costs, increased process steps, and increased technical risk.

It is, therefore, desirable to introduce additional standard designs that may be used in a plurality of production processes, leaving customization in the last few production steps, thereby saving production cost and time. Desirable in the art of "system on a chip" circuit designs, is a more time/cost efficient methodology to develop prototype and production circuits to decrease the product's time to market by using cost sharing reconfigurable modules.

SUMMARY

In view of the foregoing, this disclosure provides a method to improve today's system on a chip development time, cost, and risk through the utilization of a reconfigurable multi-project wafer that uses configurable logic or memory modules.

In one example, this methodology utilizes multi-project wafer (MPW) semiconductors to develop system on a chip (SOC) designs through the use of a standard set of validated multi-vendor modules embedded within a standard validated chip substrate. When designing a SOC on the MPW, one or more standard modules designed by one or more vendors, with verified functions, are first identified. At least one reconfigurable module of the SOC is programmed by making one or more connections through one or more connection layers. The standard modules are further connected with the programmed reconfigurable logic module according to the predetermined design of the circuit. The completed circuit is then verified for the final use.

The construction and method of operation of the invention, however, together with additional objects and advantages thereof will be best understood from the following description of specific embodiments when read in connection with the accompanying drawings.

Although the invention is illustrated and described herein as embodied in a method to improve today's system on a chip development time, cost, and risk through the utilization of a reconfigurable multi-project wafer development methodology, it is nevertheless not intended to be limited to the details shown, since various modifications and structural changes may be made therein without departing from the spirit of the invention, and within the scope and range of equivalents of the claims.

DESCRIPTION

The present disclosure provides one example of the methodology utilizing reconfigurable multi-project wafer (MPW) semiconductors to develop custom circuit designs. It is understood that a particular MPW may include a plurality of dies on it, and each may have different designs thereon. Each such die can be referred to as an adaptive SOC, and includes cost sharing units or reconfigurable modules that are customized in the last few fabrication layers with functions that can be implemented on-demand based on a customer request. The cost sharing unit may have at least one metal layer in place before one or more configurable layers are implemented. The re-configurations are performed at last few fabrication layers, and if possible, all on the last fabrication layer.

The adaptive SOC may include different design modules, or Intellectual Property (IP), from different vendors on a substrate processed up to the last few layers. The production versions of these reconfigurable adaptive SOCs may utilize reconfigurable modules such as a plurality of embedded memory devices, as well as a plurality of reconfigurable logic devices. The reconfigurable logic devices can implement any Boolean functions by some kinds of programmabilities such as by the last few interconnect layers. The SOCs may be categorized by SOCs with field configurable, mask configurable, or performance configurable functions. The reconfigurable modules with field reconfigurable functions can be programmed in field. The field programmable devices are One-Time Programmable (OTP) or Multiple-Time Programmable (MTP) FPGA, CPLD, Flash RAM or NV-RAM devices. The reconfigurable module with mask reconfigurable functions can only be programmed in fabrication plants by mask making or e-beam direct writing. Mask ROM is one of the examples. The reconfigurable module with performance reconfigurable emphasizes functionality rather than program means. Performances or functionalities can be configured such as speed, circuit rate, bandwidth, bit slice width, analog performance, or accuracy. In short, the reconfigurable modules may be a variety of devices including ASIC, memory, I/O, analog IP, RF, mix-mode IP, MEM, PLA, or PLD devices.

Although the invention is illustrated and described herein as a method for developing custom circuit designs utilizing embedded memory modules and reconfigurable logic modules, it is nevertheless not intended to be limited to the details shown, since various modifications and structural changes may be made therein without departing from the spirit of the invention, and within the scope and range of equivalents of the claims.

Figure 1:
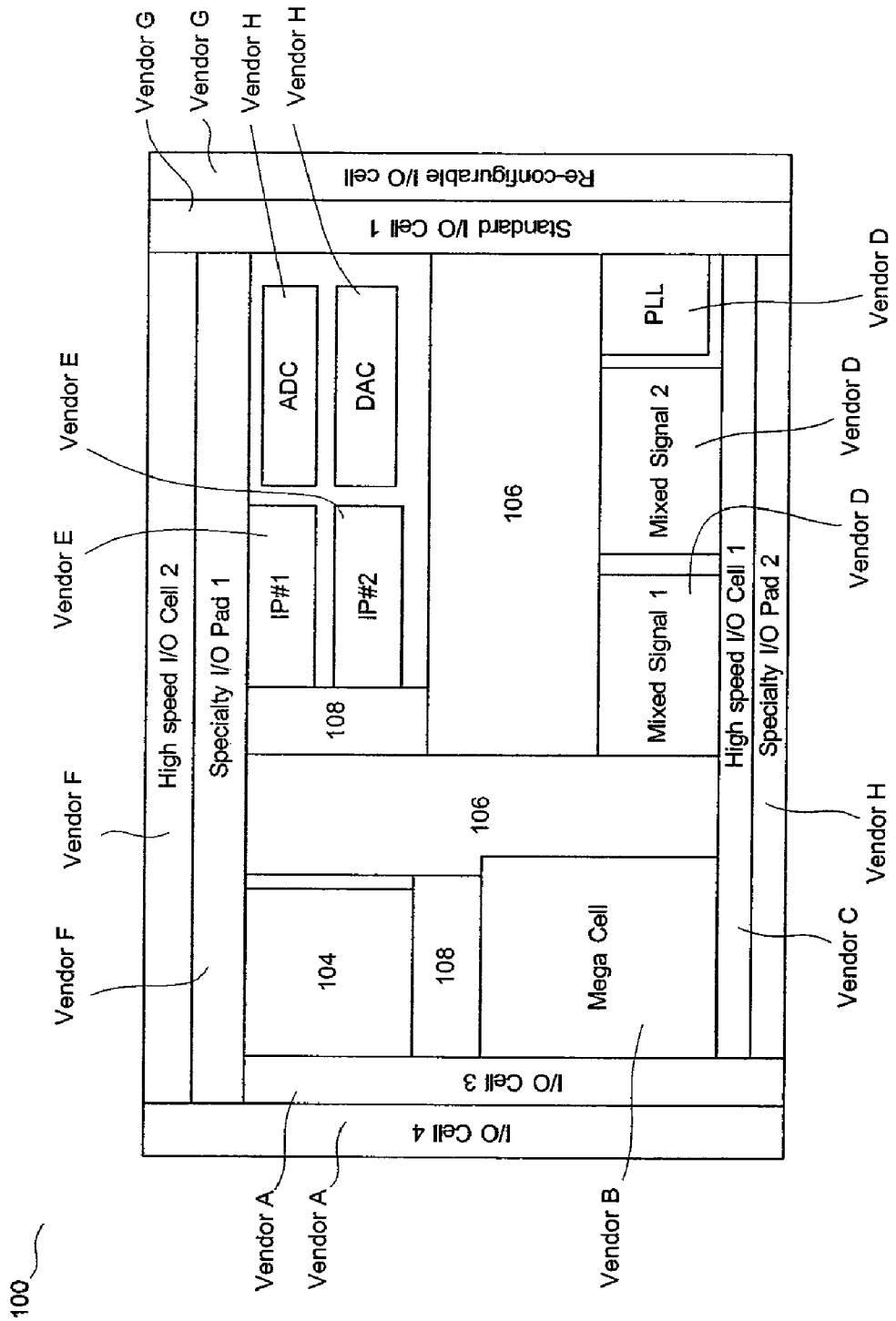
FIG. 1 presents a layout of a standard adaptive SOC on a reconfigurable MPW before customization.

FIG. 1 presents a layout of a standard adaptive SOC 100 on a reconfigurable MPW before customization. Typical standard modules are embedded within the substrate of the reconfigurable or adaptive SOC 100, and are potentially used in a custom circuit. The adaptive SOC 100 includes a reconfigurable memory module 104, a reconfigurable logic module 106, a plurality of data bus routing areas 108, as well as other standard validated functional modules (Mixed Signal, PLL, ADC, DAC, etc.), in this example, from vendors A through H, to provide the functionality needed to meet the custom circuit functional requirements. The adaptive SOC 100 have at least one connection layer installed before customization or configuration. All, or a portion of, the standard modules will be utilized to meet the final circuit requirements. The standard modules have been tested so that there is no more debugging as to the functionalities of these modules. Any unused modules will remain in the circuit substrate "unconnected" for the prototype unit, though some input and output signals are tied to VDD or ground to prevent leakage currents. These unused modules may be removed to minimize the substrate area in the production chip. Further, on an MPW, there may be different SOCs or separate and independent chips for different product designs since the wafer is a testing wafer by its nature.

The embedded memory module 104 as well as the plurality of reconfigurable logic modules 106 may be customized to meet a custom functional logic and interconnect requirements. In addition, any routing of the standard modules can be done as well. For example, data bus routing areas 108 may be realigned to ensure that data is routed properly. As such, the fabrication process for the adaptive SOC that uses validated modules is completed, except for the last few metal process steps or last few connection layers. The last few interconnect layers allow the standard adaptive SOC to be programmed or customized, as well as connecting to all needed standard modules around it for the circuit design. A quick turnaround of custom circuit designs is expected. The advantage of implementing this custom circuit design is that it can be performed in the last few metal layers, thereby minimizing the additional process steps required to complete the production SOC, while most modules are pre-built and pre-fabricated up to certain layers.

Figure 2:
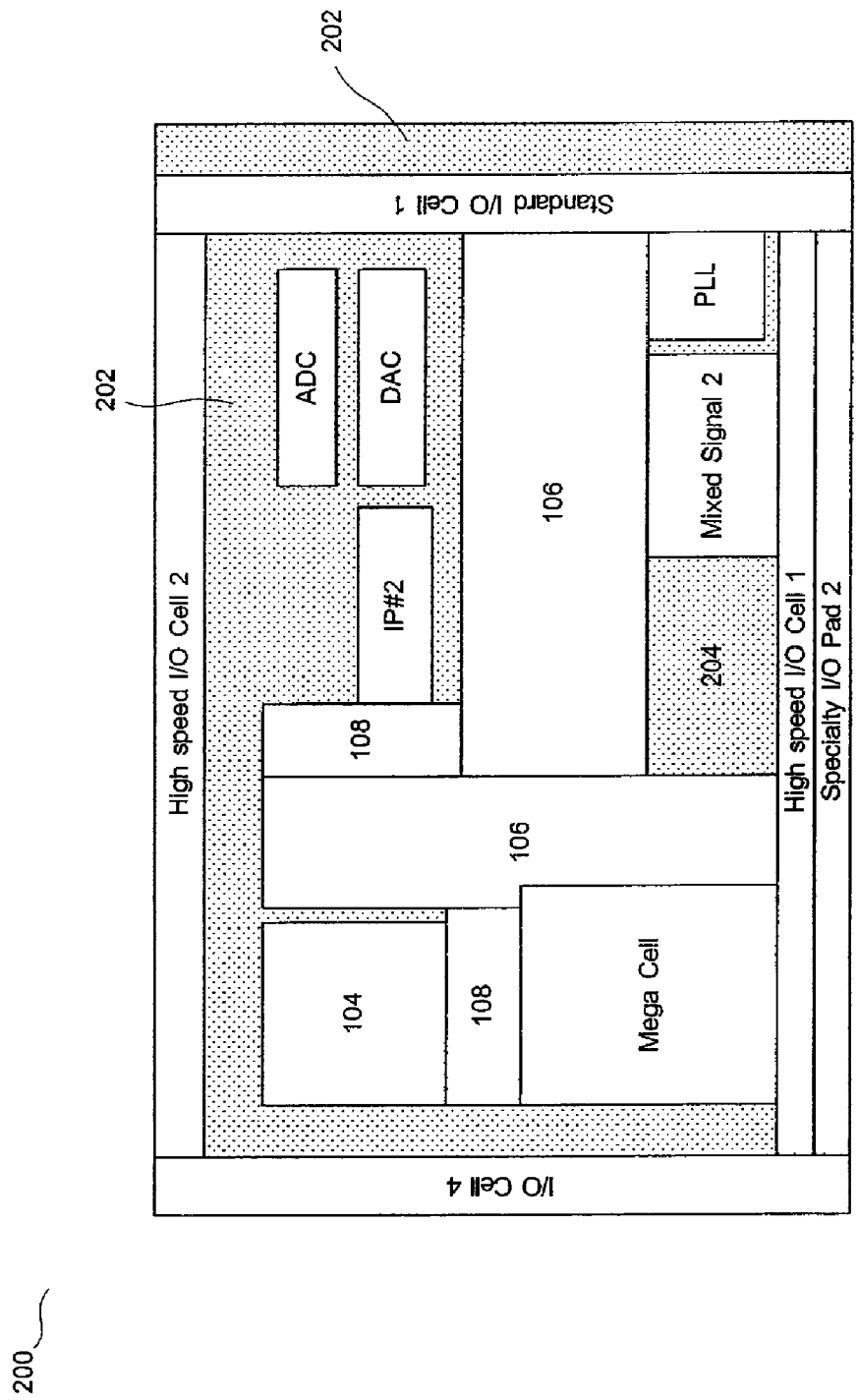
FIG. 2 presents a layout of a custom SOC after customization, in accordance with one embodiment of the present invention.

FIG. 2 presents a layout of a custom SOC 200 after customization, in accordance with one embodiment of the present invention. The custom SOC 200 is designed to meet the final circuit requirements of a particular production process. In other words, various standard functional modules of the adaptive SOC 100 have been eliminated from the drawing but still physically reside on silicon, while other functional modules, including the embedded memory module 104 as well as the plurality of reconfigurable logic modules 106, have been customized for the production process of a particular circuit client.

By comparing the layouts in FIGS. 1 and 2, it is clear by those skilled in the art that since modules such as IP#1, Mixed Signal 1, and the reconfigurable I/O cell are no longer present in FIG. 2, the substrate of the SOC 200 (illustrated by a plurality of dotted areas 202) is exposed in the drawing for clarity. In other words, the custom SOC 200 does not require the functionality of these modules. However, it is also understood that these modules may still be present in the prototype layout (for example Mixed Signal 1, as illustrated by a dotted area 204), but they are not connected and, therefore, not operational. It is noted that the spatial relationship, for the other modules in FIG. 2, has not been changed, even as the design for the layout in FIG. 2 has been customized. The metal connections and interlayer connections are made in the last few connection layers (e.g., the last two metal layers) of standard processing flow so that the reconfigurable logic module can be programmed and the standard modules are connected therewith appropriately.

At this stage, the modules are tested and verified for functionality. Because the customization is performed in the last few fabrication layers, the custom SOC 200 can be developed much more quickly than the conventional method of semiconductor design since the standard substrate physical layout has not changed, standard validated modules are utilized, and other custom modules can be implemented in the last few fabrication layers. For example, the conventional SOC cycle time can be reduced from 60 days to as short as 7 to 10 days by the utilization of this adaptive SOC process. From the cost perspective, in a typical 90-nm SOC design, the SOC cost may be reduced from $75K of a MPW to $7.5K of a reconfigurable MPW due to the reduction of customized mask layers. In other words, customers only have to pay for masks of the last few metal layers while majority of masks can be shared and amortized over huge wafer volumes.

Figure 3:
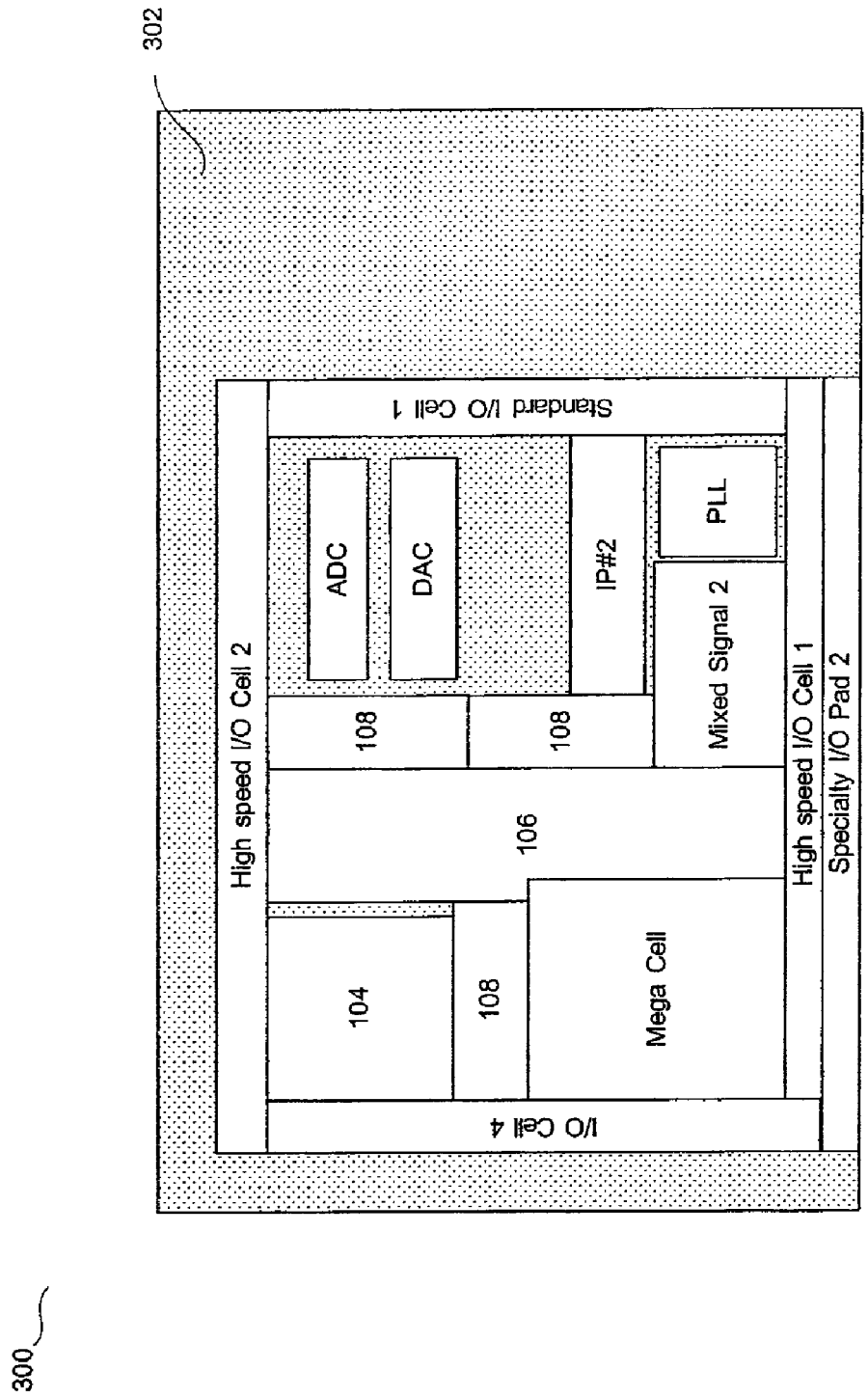
FIG. 3 presents a layout of a SOC production chip, in accordance with one embodiment of the present invention.

FIG. 3 presents a layout of a SOC production chip 300 in accordance with one embodiment of the present invention. In the SOC production chip 300, while the same validated standard modules (e.g., the embedded memory module 104, ADC, DAC etc.) are used, the physical layout has been rearranged to minimize the required circuit substrate area as shown by the unused area 302. Therefore, the same circuit design may be implemented onto a smaller die, which increases the wafer yield. The production chip meets the functional custom circuit requirements, but has drastically lowered the cost and time requirements of the conventional circuit development through the use of standard validated modules already fabricated onto a substrate and the customization of the logic, memory and interconnections in the last few metal process layers, preferably in the last metal process layers.

It is noted that the SOC has at least a memory module such as a Static Random Access memory (SRAM) module, and an input/output module to be connected to and working with the reconfigurable module by metal connections for constructing sequential or combinational logic. It is further noted that the SOC contains multiple designs from different vendors, and the functionality of the overall chip is achieved by using metal connections to deliver such functions.

Figure 4:
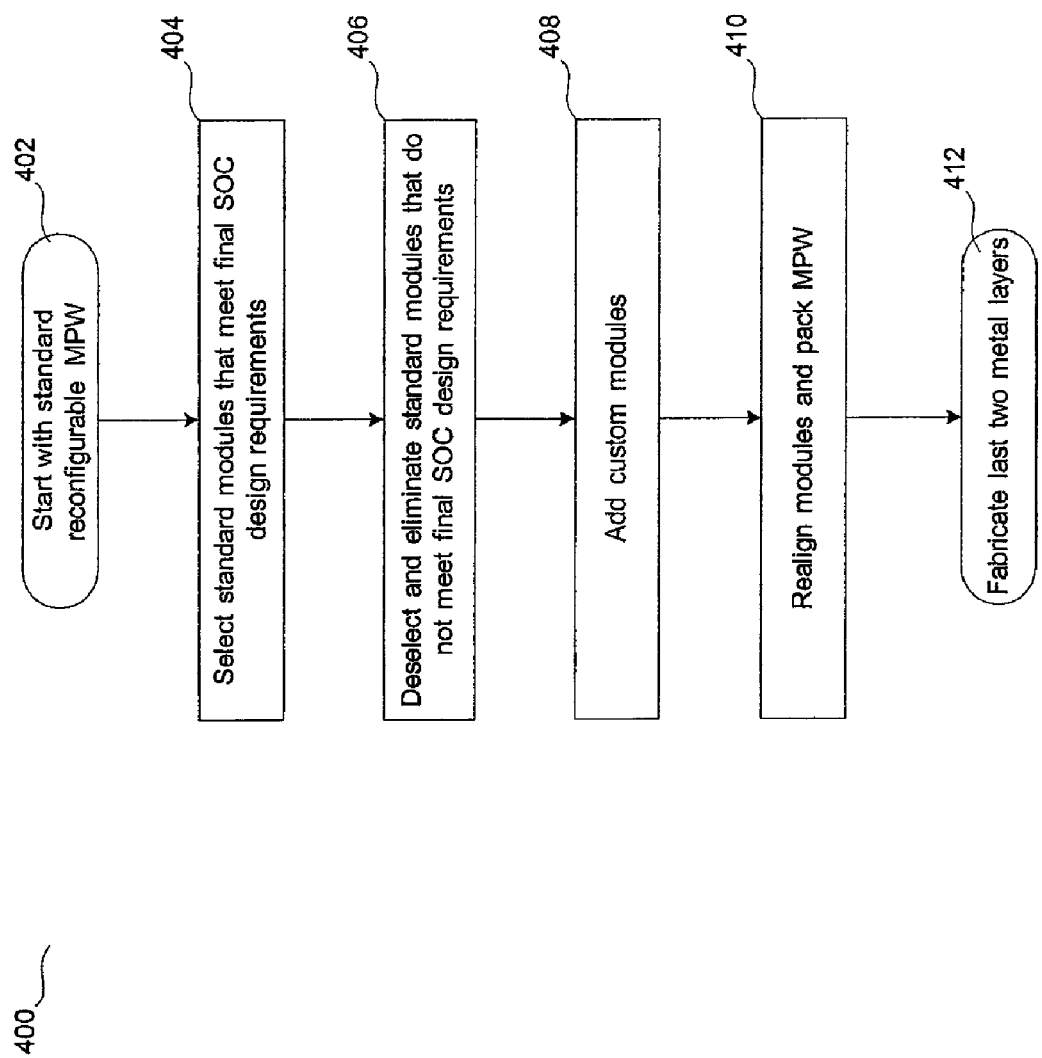
FIG. 4 presents a flow diagram illustrating steps involved for fabricating a SOC design using reconfigurable modules in accordance with one embodiment of the present invention.

FIG. 4 presents a flowchart 400 illustrating a production of a device using adaptive SOCs in accordance with one embodiment of the present invention. The flow starts at step 402, where a standard reconfigurable MPW including one or more adaptive SOCs, such as the SOC 100, is selected for a predetermined SOC design. The adaptive SOCs can be turned into various devices depending on the routing of certain connection layers. That is, certain functions of the SOC can be activated based on the routing of the connection layers. The flow then proceeds to step 404, where all standard modules that meet the final SOC design requirements are selected for inclusion. The flow proceeds to step 406, where all standard modules that do not meet the final SOC design requirements are deselected and excluded from being "connected." The flow then proceeds to step 408, where the reconfigurable modules are programmed by configuring the connection lines in the last few metal layers or connection layers to complete the final SOC design. For example, at least one of the last connection layers is used to customize the reconfigurable module. Before final fabrication steps are performed, the MPW may be realigned and packed in step 410 to minimize the required substrate area. Finally, in step 412, the SOC on the MPW is scheduled for final fabrication steps.

In summary, when the SOC is used for designing a semiconductor circuit, one or more standard modules designed by one or more vendors with verified functions are first identified. At least one reconfigurable logic module of the SOC is programmed by making one or more connections through one or more connection layers. The standard modules are further connected with the programmed reconfigurable logic module according to the predetermined design of the circuit. The completed circuit is then verified for final uses. It is understood that the standard modules contain at least a memory module and an input/output module, and wherein the programming of the reconfigurable logic module and the connecting of modules are implemented in the last few connection processes of a manufacturing flow, in which metal connections and interlayer connections are made.

As for the SOC, it is a standard validated chip substrate which would be complete, except for the last few (e.g., the last two) connection layers to allow for the customization of memory and logic designs. This standard validated chip substrate can be utilized for any number of custom designs through the selection of verified standard modules and the addition of custom logic, memory, and interconnections. The circuit design has functional requirements that determine which of the standard modules that would be utilized and interconnected for the final prototype design. All other modules contained within the substrate would not be utilized for the prototype, but would remain internal to the chip. The custom logic reconfiguration and custom module interconnections can be performed during the last few connection layers, thus minimizing the process steps required to complete the SOC, and thus minimizing the fabrication steps needed to produce a prototype circuit. After the validation of the prototype circuit design, the production chip requires only final layout changes to minimize the required substrate area by removing any unused modules.

The above disclosure provides many different embodiments, or examples for implementing different features of the disclosure. Specific examples of components and processes are described to help clarify the disclosure. These are, of course, merely examples, and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly, and in a manner consistent with the scope of the disclosure, as set forth in the following claims.

What is claimed is:

1. A method for producing a semiconductor device using adaptive system-on-chips (SOCs) on an reconfigurable multi-project wafer (MPW), comprising:
    selecting one or more standard modules that meet final design requirements for a predetermined SOC, the standard modules having verified functions;
    removing non-selected standard modules that do not meet the final design requirements for the predetermined SOC to minimize a required layout area;
    programming one or more reconfigurable modules by making connections using at least one of the last connection layers in the fabrication steps, wherein the one or more reconfigurable modules include a reconfigurable memory module and a reconfigurable logic module;
    realigning the standard and reconfigurable modules to minimize a required substrate area of the MPW; and
    forming the at least one of the last connection layers for programming the one or more reconfigurable modules and for connecting the one or more standard modules with the programmed reconfigurable modules.

2. The method of claim 1, wherein the standard modules are standard validated functional modules from various vendors to provide a functionality needed to meet custom circuit functional requirements.

3. The method of claim 1, wherein the reconfigurable modules comprise at least one metal layer placed prior to the functions being activated.

4. The method of claim 1, wherein the reconfigurable modules further comprise a field reconfigurable unit.

5. The method of claim 1, wherein the reconfigurable modules comprise a logic unit.

6. The method of claim 1, wherein the reconfigurable modules comprise a memory unit.

7. The method of claim 1, the reconfigurable modules comprise a mask reconfigurable module.

8. The method of claim 7, the mask reconfigurable module comprises at least one I/O unit.

9. The method of claim 7, the reconfigurable module comprises a performance reconfigurable module.

10. The method of claim 1, the SOC has at least a memory module including a static random access memory (SRAM).

* * * * *